(12) United States Patent
Urakawa

(10) Patent No.: US 7,977,159 B2
(45) Date of Patent: Jul. 12, 2011

(54) MEMORY CHIP AND SEMICONDUCTOR DEVICE USING THE MEMORY CHIP AND MANUFACTURING METHOD OF THOSE

(75) Inventor: Yukihiro Urakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 11/369,935

(22) Filed: Mar. 8, 2006

(65) Prior Publication Data

US 2006/0148130 A1 Jul. 6, 2006

Related U.S. Application Data

(62) Division of application No. 10/787,413, filed on Feb. 27, 2004, now Pat. No. 7,466,029, which is a division of application No. 10/190,500, filed on Jul. 9, 2002, now Pat. No. 6,737,743.

(30) Foreign Application Priority Data

Jul. 10, 2001 (JP) .................................. 2001-209729

(51) Int. Cl.
*H01L 21/00* (2006.01)
(52) U.S. Cl. .......... 438/108; 257/E21.526; 257/E25.013
(58) Field of Classification Search .................. 438/109, 438/108; 257/E21.526, E25.013; 700/117
See application file for complete search history.

(56) References Cited

U.S. PATENT DOCUMENTS

| | | | |
|---|---|---|---|
| 4,408,875 A | 10/1983 | Majima | |
| 4,907,203 A * | 3/1990 | Wada et al. ................. | 365/238.5 |
| 5,506,499 A * | 4/1996 | Puar ............................ | 324/158.1 |
| 5,598,033 A * | 1/1997 | Behlen et al. ................. | 257/686 |
| 5,661,662 A * | 8/1997 | Butts et al. ....................... | 716/16 |
| 5,737,767 A * | 4/1998 | Agrawal et al. ................ | 711/171 |
| 5,943,254 A * | 8/1999 | Bakeman et al. ................ | 365/72 |
| 6,055,594 A * | 4/2000 | Lo et al. ......................... | 710/100 |
| 6,078,096 A | 6/2000 | Kimura et al. | |
| 6,172,409 B1 * | 1/2001 | Zhou ............................. | 257/620 |
| 6,372,554 B1 | 4/2002 | Kawakita et al. | |
| 6,417,695 B1 * | 7/2002 | Duesman ........................ | 326/47 |
| 6,424,034 B1 * | 7/2002 | Ahn et al. ...................... | 257/723 |

(Continued)

FOREIGN PATENT DOCUMENTS

JP  63-261852  10/1988

(Continued)

OTHER PUBLICATIONS

Wang, Memory and Logic Integration for System-in-a-Package, Computer Engineering Department, University of California, Santa Cruz, pp. 843-847.*

(Continued)

*Primary Examiner* — Matthew C Landau
*Assistant Examiner* — Latanya Crawford
(74) *Attorney, Agent, or Firm* — Oblon, Spivak, McClelland, Maier & Neustadt, L.L.P.

(57) ABSTRACT

In a wafer, a plurality of basic chips F is arranged therein. The basic chip F has a memory capacity of i-mega bytes. By dicing, a memory chip including four basic chips F is cut out of the wafer. The memory chip has a memory capacity of 4×i-mega bytes. A dicing line is interposed between four basic chips F configuring the memory chip, Four basic chips F can change word organization by a control signal individually.

19 Claims, 16 Drawing Sheets

U.S. PATENT DOCUMENTS

| | | | |
|---|---|---|---|
| 6,594,818 B2 | 7/2003 | Kim et al. | |
| 6,646,342 B2 * | 11/2003 | Sakiyama et al. | 257/723 |
| 6,677,674 B2 | 1/2004 | Nagao | |
| 6,798,049 B1 * | 9/2004 | Shin et al. | 257/678 |
| 6,901,015 B2 * | 5/2005 | Shinohara | 365/200 |
| 6,969,623 B1 * | 11/2005 | Ikeda et al. | 438/15 |
| 2001/0002179 A1 * | 5/2001 | Tomita et al. | 365/223 |
| 2001/0036738 A1 * | 11/2001 | Hatanaka et al. | 438/693 |
| 2001/0040281 A1 * | 11/2001 | Butler | 257/686 |
| 2002/0136046 A1 * | 9/2002 | Kim et al. | 365/63 |
| 2002/0140107 A1 * | 10/2002 | Kato et al. | 257/777 |
| 2002/0164838 A1 * | 11/2002 | Moon et al. | 438/107 |

FOREIGN PATENT DOCUMENTS

| | | |
|---|---|---|
| JP | 1-235264 | 9/1989 |
| JP | 4-157695 | 5/1992 |
| JP | 4-343469 | 11/1992 |
| JP | 4-373169 | 12/1992 |
| JP | 2000-49307 | 2/2000 |
| JP | 2000-195962 | 7/2000 |
| JP | 2000-223657 | 8/2000 |
| JP | 2000223657 A * | 8/2000 |
| JP | 2000-340746 | 12/2000 |
| JP | 2000-349130 | 12/2000 |
| JP | 2001-176263 | 6/2001 |
| WO | WO 02/082540 A1 | 10/2002 |

OTHER PUBLICATIONS

Tadahiko Sugibayashi, et al., "A 1gB DRAM for File Applications", ISSCC Digest of Technical Papers, 1995. pp. 254-255.

* cited by examiner

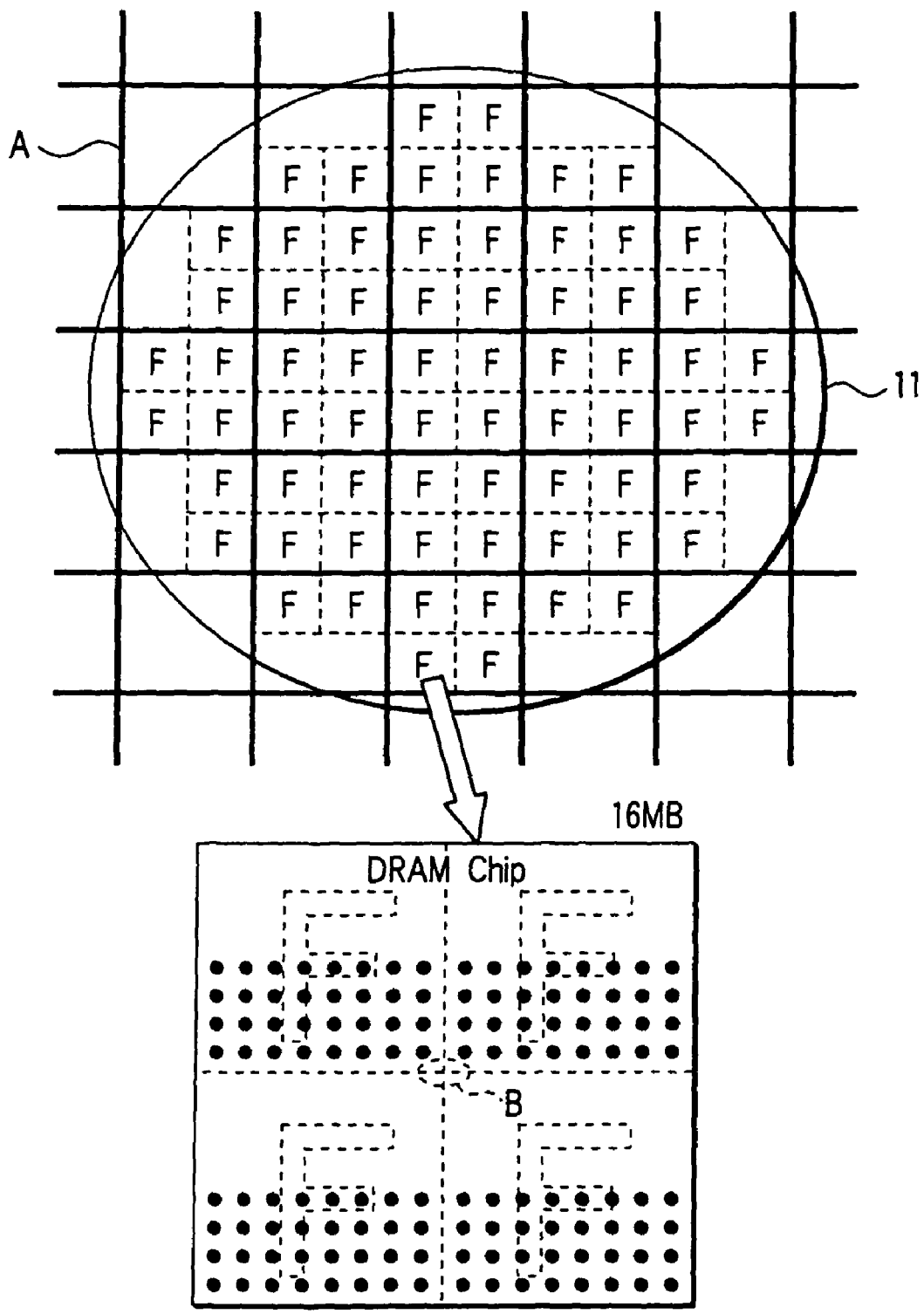
F I G. 2

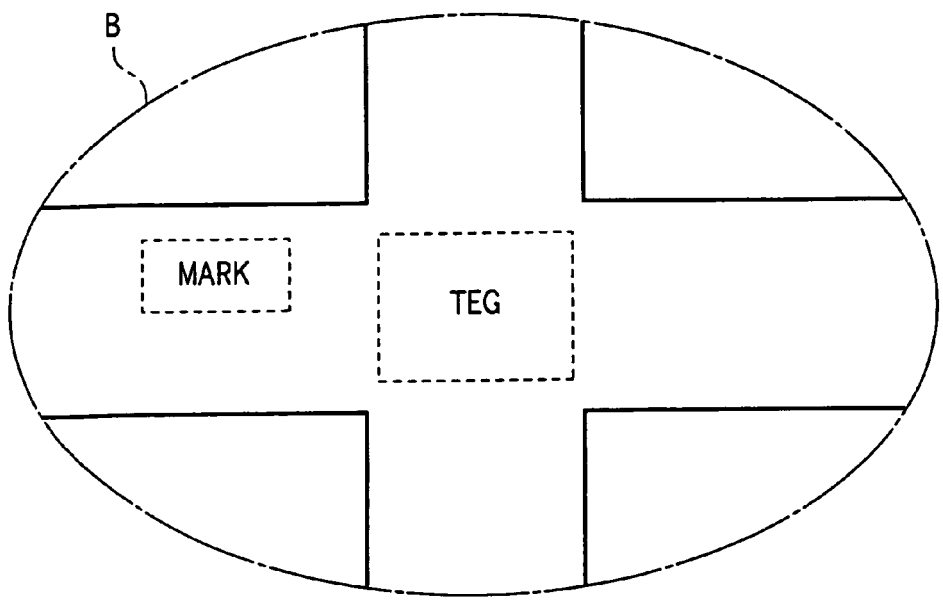
F I G. 3
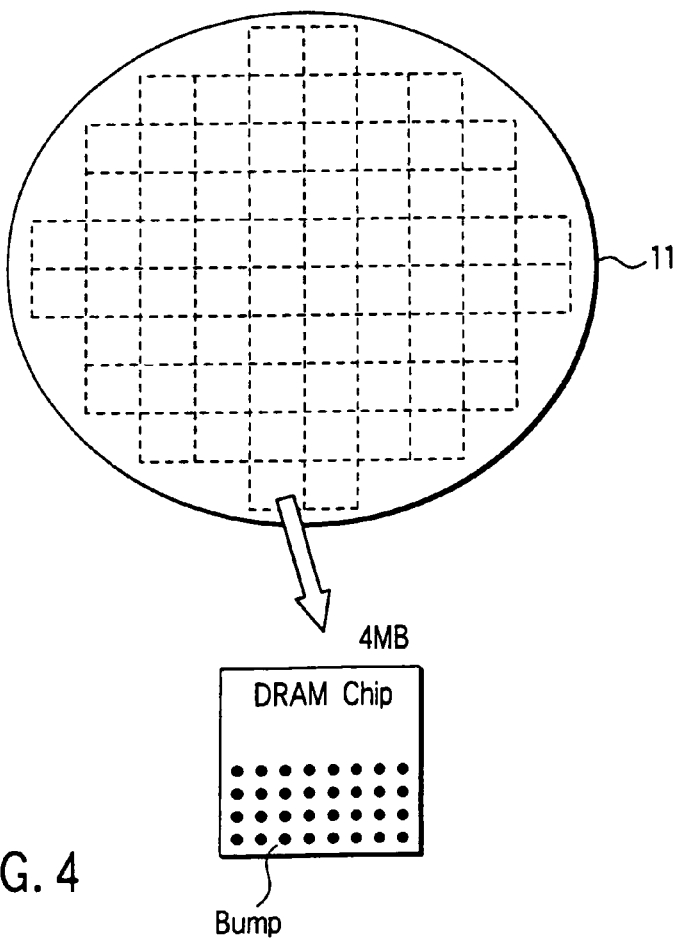
F I G. 4

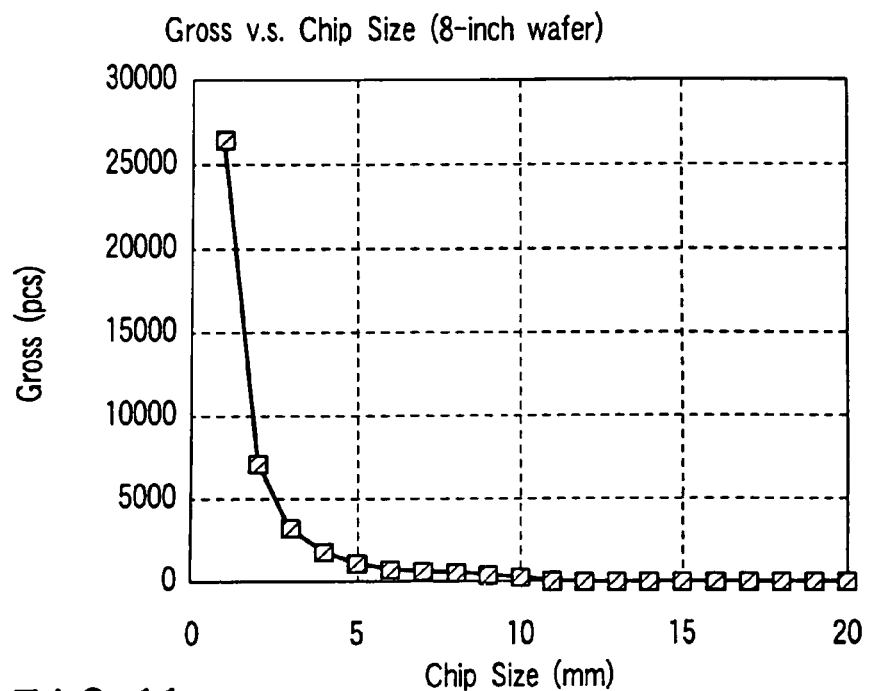
F I G. 11
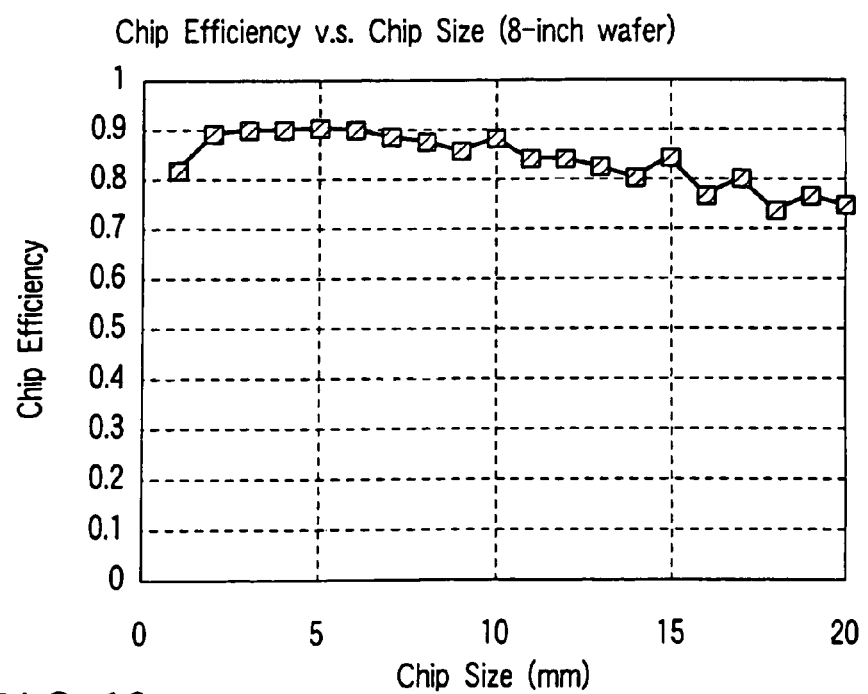
F I G. 12

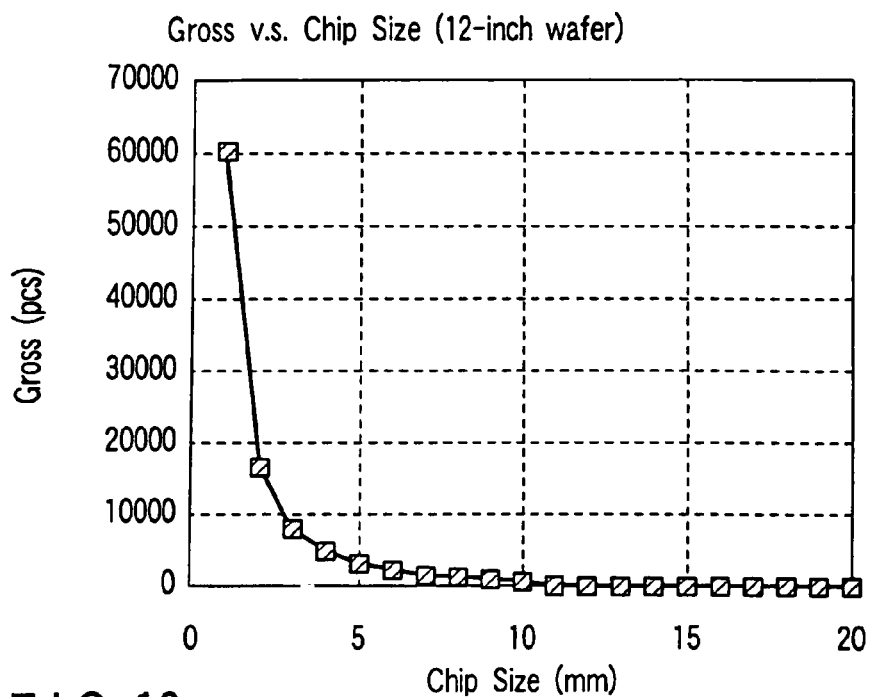
F I G. 13
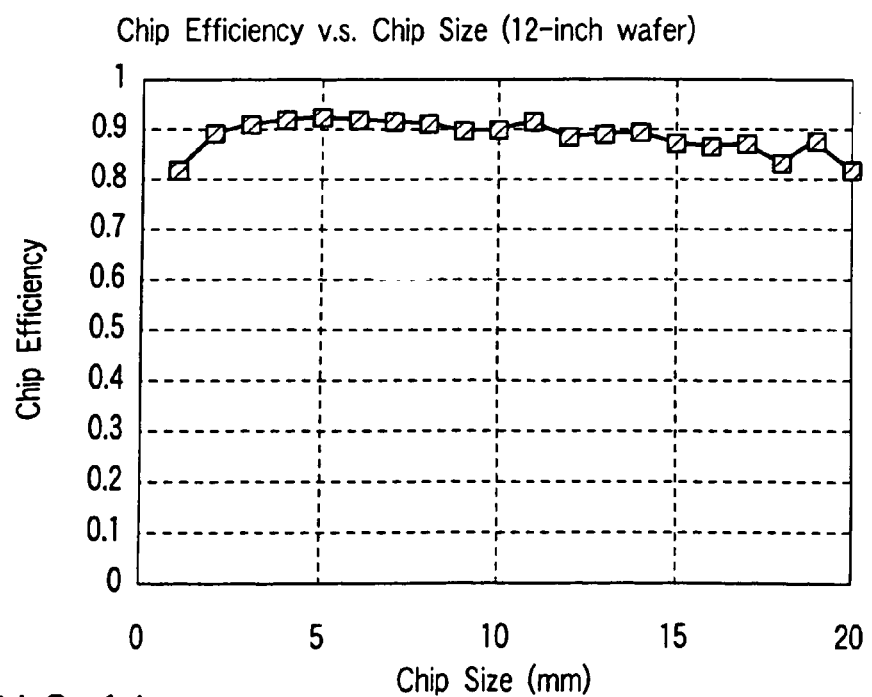
F I G. 14

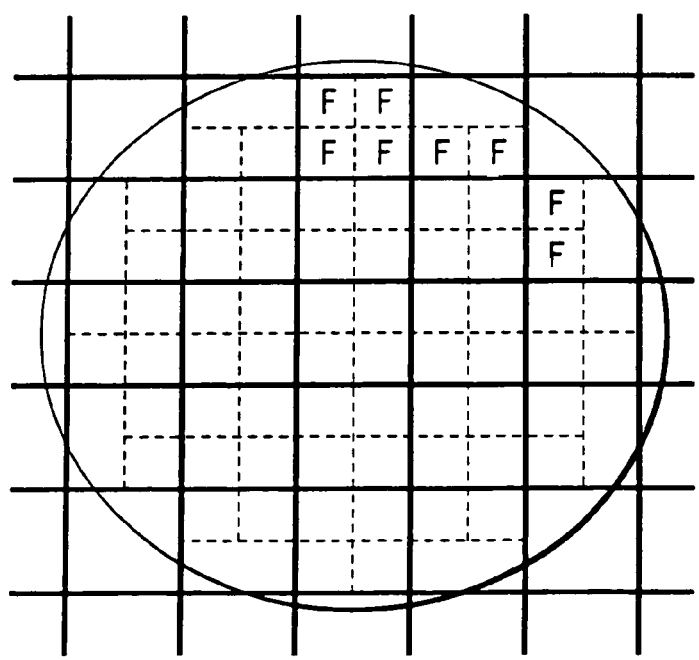
F I G. 15B

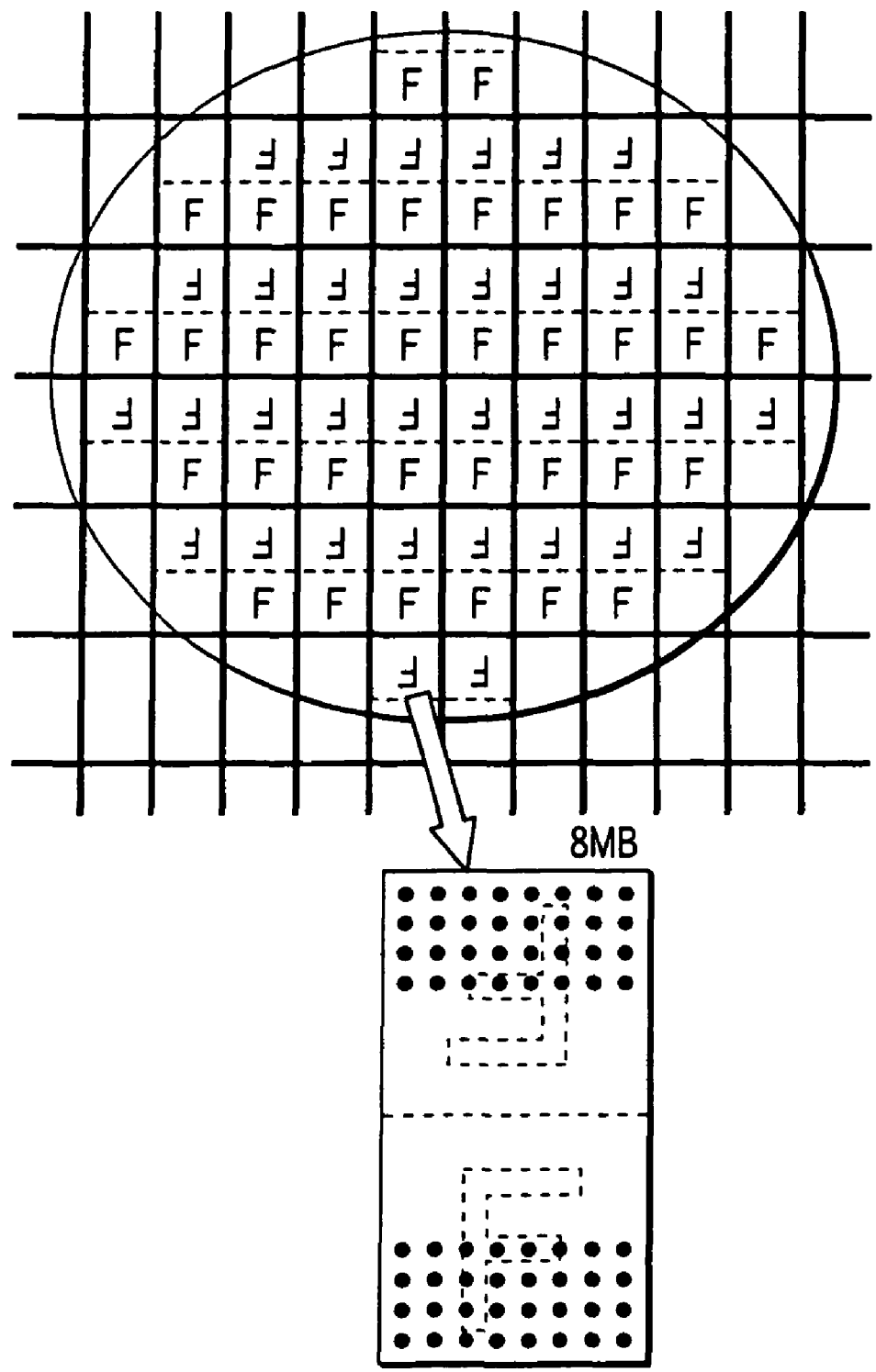
F I G. 18

MEMORY CHIP AND SEMICONDUCTOR DEVICE USING THE MEMORY CHIP AND MANUFACTURING METHOD OF THOSE

CROSS-REFERENCE TO RELATED APPLICATIONS

This application is based upon and claims the benefit of priority from the prior Japanese Patent Application No. 2001-209729, filed Jul. 10, 2001, the entire contents of which are incorporated herein by reference.

BACKGROUND OF THE INVENTION

1. Field of the Invention

The present invention relates to a COC (Chip On Chip) device, which configures one system in a manner that a semiconductor chip is stacked with another semiconductor chip having a function different from the preceding semiconductor chip, and a SiP (System in Package) device, for example, MCM (Multi Chip Module) device, which configures one system in a manner that one package includes a plurality of chips.

2. Description of the Related Art

In recent years, a so-called SOC (System On Chip) technology has been researched and developed. More specifically, functions realized by CPU and IP (Intellectual Property), memories (e.g., SRAM, DRAM and flash memory) and analog LSI (e.g., RF circuit) are embedded in one chip so that one system can be formed in one chip. One system is formed in one chip, and thereby, there is no need of mutually connecting a plurality of chips by external interconnection lines (metal wires); therefore, it is possible to realize high performance system and system miniaturization.

However, in order to realize an LSI (hereinafter, referred to as SOC) embedding a plurality of functions in one chip, there are various difficult problems to solve.

For example, a memory embedded logic LSI and an analog embedded logic LSI have been known as a typical SOC. In the above memory embedded logic LSI, a process peculiar to memory (e.g., in the case of DRAM, trench/stack capacitor manufacturing process) must be added to a logic process. Moreover, in the above analog embedded logic LSI, a process peculiar to analog circuit (e.g., bipolar transistor manufacturing process) must be added to a logic process.

For this reason, in the above-mentioned SOC, the manufacturing process (hereinafter, referred to as embedded process) is very complicate and becomes long. As a result, there remain problems such as a reduction of yield and an increase of the manufacture cost.

Further, naturally, the above-mentioned SOC is formed in a manner that a plurality of functions (chips), which has been formed by mutually different manufacturing process, is incorporated into one chip. For this reason, it is a significant matter to optimize an embedded process when forming one chip. However, in this case, since different plural manufacturing processes are incorporated into one embedded process in common, of course, compromise must be made in device performance or integration in the case of incorporating different processes in common.

For example, in a DRAM embedded-logic LSI, a logic process is used as base, and a process peculiar to DRAM is added to the logic process. In this case, the logic process includes a Salicide (Self-Align silicide) process for reducing each resistance of gate, source and drain of a MOS transistor.

On the other hand, a DRAM process includes a SAC (Self-Align Contact) for achieving a high integration of memory-cell.

However, according to current process technology, if the silicide process and the SAC process are incorporated into one manufacturing process (embedded process), a number of a process steps are sharply increased and a cost of a chip is upped. For decrease of the chip cost, it doesn't become easy to employ both of the above silicide and SAC processes, namely, any one of the above silicide and SAC processes must be abandoned.

Temporarily, in the case where logic performance is preferentially considered, the Salicide process is employed; on the other hand, the SAC process is not employed. As a result, a memory cell side becomes large; for this reason, it is disadvantage to achieve high integration of memory cell. Conversely, in the case where the above high integration of memory cell is preferentially considered, the SAC process is employed; on the other hand, the Salicide process is not employed. As a result, the logic performance is reduced.

BRIEF SUMMARY OF THE INVENTION

According to one aspect of the invention, there is provided a memory chip comprising: a plurality of basic chips capable of functioning as a memory chip independently from each other; and a dicing line interposed between the plurality of basic chips; wherein the dicing line configures a part of the memory chip.

According to another aspect of the invention, there is provided a COC device comprising: a logic chip having a logic circuit; a memory chip mounted on the logic chip; and a bump connecting the logic chip and the memory chip.

According to another aspect of the invention, there is provided a MCM device comprising: a package substrate; a logic chip on the package substrate, having a logic circuit; a memory chip on the package substrate; and a conductive line electrically connecting the logic chip and the memory chip.

According to another aspect of the invention, there is provided a manufacturing method of a memory chip comprising: forming a plurality of basic chips in a wafer; carrying out a test of the plurality of basic chips; determining a number of basic chips configuring the memory chip based on a predetermined memory capacity; determining a shape of the memory chip based on the test result and the number of the basic chips; and obtaining the memory chip by dicing the wafer.

According to another aspect of the invention, there is provided a SiP device comprising: above-mentioned COC device or above-mentioned MCM device; and a package covering the COC device or the MCM device.

BRIEF DESCRIPTION OF THE SEVERAL VIEWS OF THE DRAWING

FIG. 2 is a view showing a memory chip according to one embodiment of the present invention;

FIG. 3 is an enlarged view showing a region B shown in FIG. 2;

FIG. 4 is a view showing a chip cut out of a wafer;

FIG. 11 is a graph showing a relation between a chip size and gross;

FIG. 12 is a graph showing a relation between a chip size and a chip efficiency;.

FIG. 13 is a graph showing a relation between a chip size and gross;

FIG. 14 is a graph showing a relation between a chip size and a chip efficiency;

FIG. 15B is a view to explain a chip efficiency of the present invention;

FIG. 18 is a view showing another memory chip according to one embodiment of the present invention;

DETAILED DESCRIPTION OF THE INVENTION

A memory chip according to one aspect of the present invention, a semiconductor device using the memory chip and a manufacturing method of those will be described below with reference to the accompanying drawings.

The semiconductor device includes a SiP device, for example, a COC device and a MCM device. The COC device will be mainly described below.

[COC Technology]

First of all, a so-called COC (Chip On Chip) technology will be described.

In order to solve the conventional problems, in recent years, the COC technology has attracted special interest. According to the COC technology, one system is configured in a manner that a semiconductor chip is stacked with another semiconductor chip having a function different from the preceding semiconductor chip.

Figure 1:
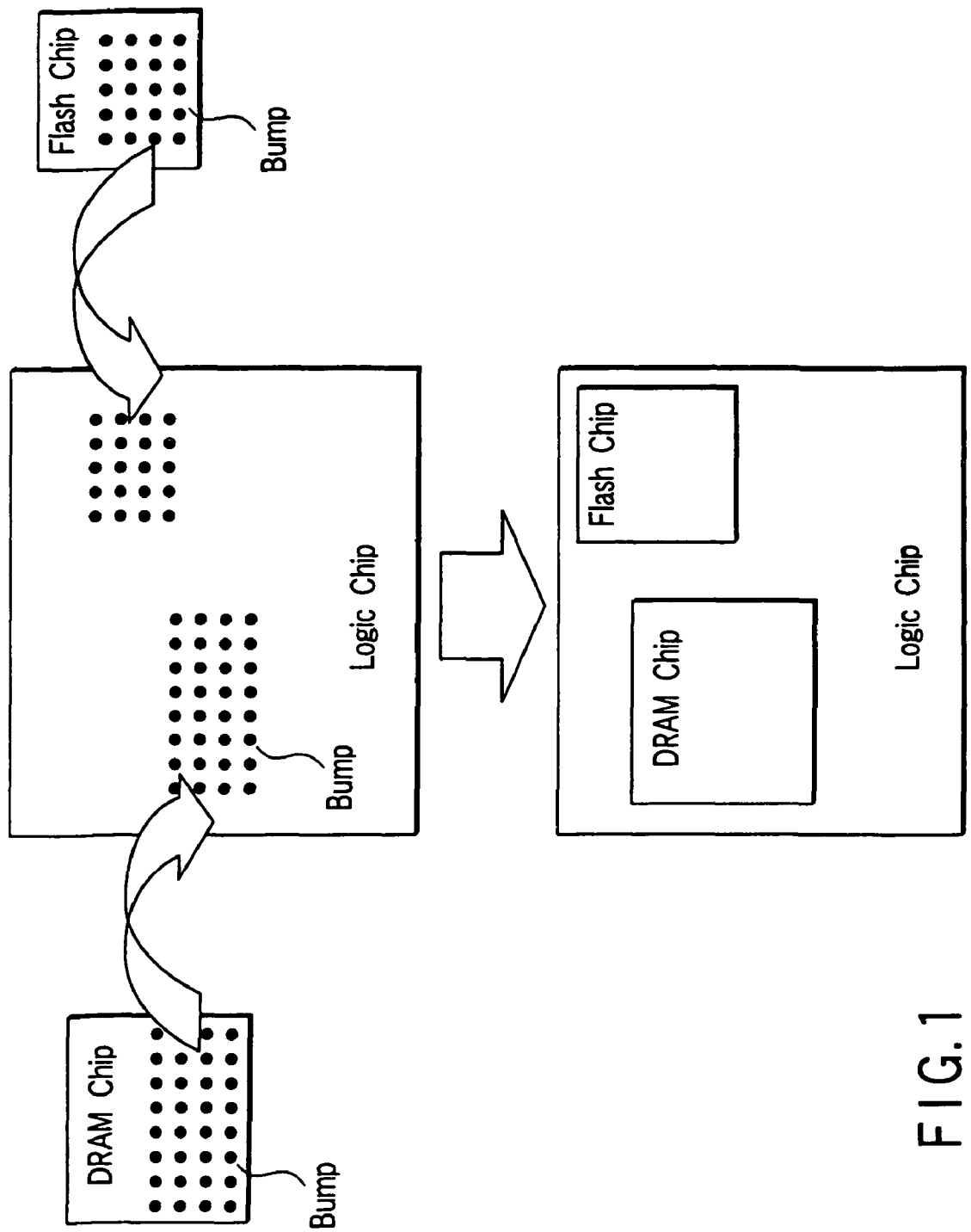
FIG. 1 is a view showing a COC device as the subject of the present invention.

In a COC device, for example, as shown in FIG. 1, memory chips (e.g., DRAM chip, flash memory chip, etc.) are directly mounted on an LSI chip (hereinafter, referred to as logic chip) having a logic circuit via a bump (e.g., Au bump).

Currently, the bump is formed with a pitch of 40 to 50 μm; therefore, in principle, it is possible to arrange the bump on each chip with a high density of 400 piece/mm². That is, in the COC device, it is possible to increase the number of data input-output terminals; therefore, a bus bandwidth (number of bits inputted and outputted simultaneously) can be made very large, like the system LSI.

Moreover, since the logic chip and the memory chip are mutually connected by the bump, neither large parasitic capacitance is connected to an input-output terminal of an interface section of each chip, nor a noise is inputted from the input-output terminal. Therefore, there is no need of connecting a buffer and a protective circuit to each input-output terminal of interface section of the logic chip and the memory chip. In other words, the interface section of the logic chip and the memory chip is simplified, so that each chip size can be made small.

In this case, the bump on the logic chip corresponds in its position to the pump on the memory chip. For example, it is possible to readily making a connection between the logic chip and the memory chip by flip chip bonding.

Further, as shown in FIG. 1, in the case of mounting the memory chip on the logic chip, the memory chip is formed by only adding one interconnection layer (interconnection layer for forming a bump) to an already existing general-purpose memory, so that the development cost can be reduced.

As described above, the above COC technology is employed, and thereby, it is possible to readily solve various problems (relative to process common incorporation by one chip and development cost) arisen in the case of realizing the SOC by the embedded process. Therefore, the COC technology is very promising.

However, the above COC technology has also the following problem.

For example, in the case where one system is configured to mount the memory chip on the logic chip, no problem arises if there exists an already existing general purpose memory, which has a memory capacity and word organization (number of data input-output terminals) coincident with user's request. But, in the case where there exist no the desired memory required by the user, a memory chip coincident with the user's desired specification is designed using EAD (Engineering Design Automation) tool such as memory generator, and thereafter, the designed memory chip must be further evaluated. As a result, a problem arises such that the development period of time becomes long, and the development cost increases.

In view of the above problem, according to the COC technology, usually, the following method is employed such that a chip having the specification closest to user's request is selected from a prepared COC memory chip lineup.

Therefore, the more the number of the COC memory chip lineup is increased, the more a chip having the specification close to or substantially identical to the user's request can be selected from the lineup. However, the number of the COC memory chip lineup is increased, and thereby, a great many of time and cost are spent for the increase of the COC memory chip lineup.

On the other hand, the number of the COC memory chip lineup is decreased, and thereby, the time and cost is reduced. However, this is a factor of reducing a probability that the above chip having the specification close to or substantially identical to the user's request exists in the lineup. As a result, a large difference (overhead) is generated between the specification required by the user and the specification of the chip selected from the lineup.

For example, there is the case where the specification required by the user is 1 mega words×64 bits. In this case, of the lined-up COC memory chips, in the case where a chip satisfying the specification and having a specification closest to the specifications is 2-mega words×64bits, a memory capacity of 1 mega words×64 bits (=8 mega bytes) becomes wasteful; for this reason, efficiency becomes worse.

Therefore, if the following courses are realized, it is very advantageous. More specifically, one course is that the number of the COC memory chip lineup is not increased, but one memory chip comprising one or plural basic chips is arbitrarily cut out of a wafer, and thereby, a memory chip having user's desired memory capacity is freely obtained.

Further, another course is that a word organization of the basic chip is freely changed using a control signal.

[Memory Chip and COC Device]

FIG. 2 shows a memory chip according to one embodiment of the present invention.

A wafer 11 is formed with a plurality of basic chips (shown by alphabet F). A memory capacity of the basic chip is set to a predetermined value, that is, 4 MB (mega bytes) in this embodiment. Moreover, a word organization of the basic chip is set to a predetermined word organization (e.g., 1 mega words×32 bits, 512 kilo words×64 bits, etc.).

In a wafer state, the plurality of basic chips is arranged in the wafer 11, and the general wafer 11 is configured. However, according to the present invention, a memory chip including the plurality of basic chips is cut out of the wafer 11. For example, the wafer 11 is cut along a lattice line A of FIG. 2.

More specifically, the memory chip of the present invention comprises a chip assembly of plural basic chips (four basic chips in this embodiment), each of which is capable of functioning as one memory chip. Therefore, the plural basic chips are electrically separated from each other (not connected by interconnection lines), and further, a dicing line (or scribe line) is interposed between the plural basic chips. The dicing line is formed with an alignment MARK and TEG (Test Element Group), as shown in FIG. 3.

As described above, according to the present invention, a memory chip having a memory capacity of 16 MB can be comprised of four basic chips. In general, when the memory capacity of the basic chip. is set as i byte, an I-byte memory chip can be obtained from an assembly of (I/i) basic chips. In this case, I is integer multiples of i.

Incidentally, as shown in FIG. 4, only one basic chip may be cut out of the wafer 11.

Figure 5:
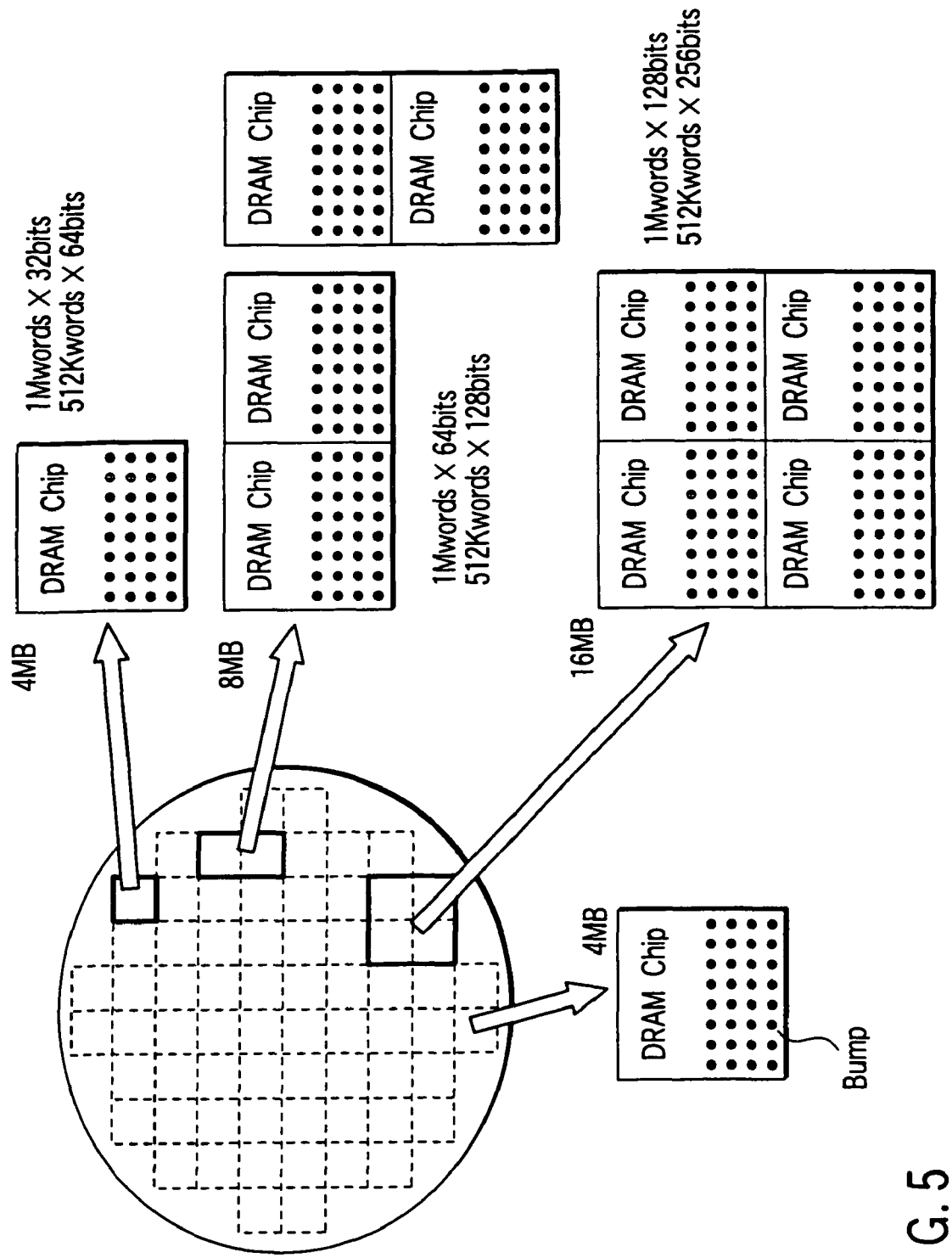
FIG. 5 is a view showing a chip cut out of a wafer.

FIG. 5 shows various kinds of memory chips obtained from a wafer.

First, the following premise is made that a memory capacity of the basic chip is 4 MB (=32 mega bits), and a word organization is 1 mega words×32 bits (=4 mega bytes).

In the case where a memory chip comprises one basic chip, the memory chip has a memory capacity of 4 MB and a word organization of 1 mega words×32 bits. Further, the case where a memory chip comprises two basic chips, the memory chip has a memory capacity of 8 MB and a word organization of 1 mega words×64 bits. Further, the case where a memory chip comprises four basic chips, the memory chip has a memory capacity of 16 MB and a word organization of 1 mega words×128 bits.

In this case, it is preferable that the memory chip has a square shape, regardless of the number of basic chips. The reason is because a chip shape is square, and thereby, handling is easy in carrying memory chip and in alignment, like an ordinary chip.

Figure 6A:
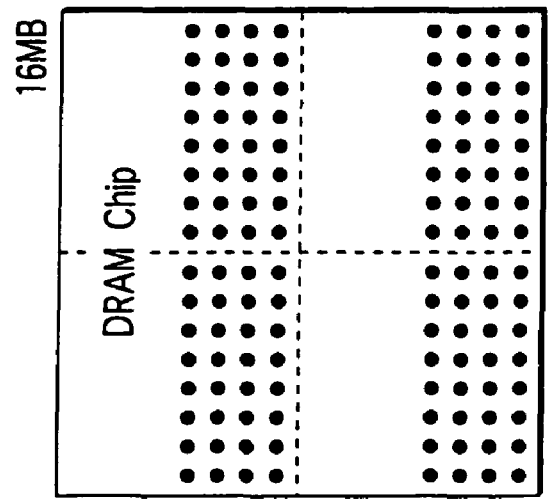
FIG. 6A is a view showing another memory chip according to one embodiment of the present invention.
Figure 6B:
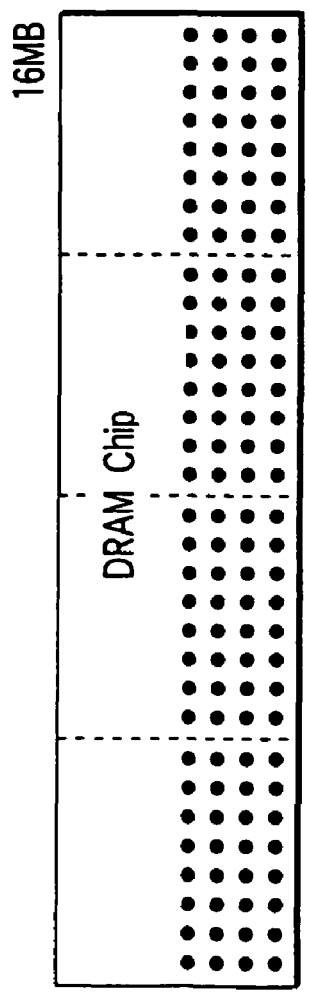
FIG. 6B is a view showing another memory chip according to one embodiment of the present invention.
Figure 6C:
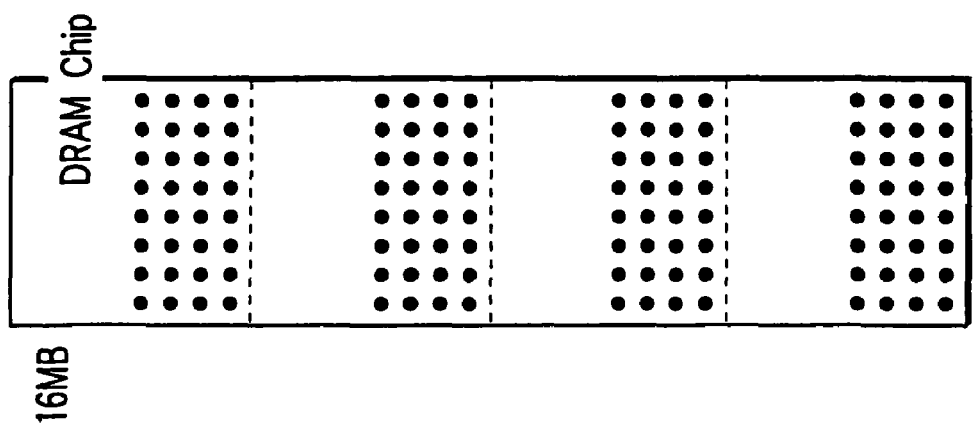
FIG. 6C is a view showing another memory chip according to one embodiment of the present invention.

As shown in FIG. 6A, the memory chip comprises a plurality of basic chips, which are adjacent to each other in vertical (up and down) and horizontal (right and left) directions, and thereby, the memory chip is easy to become square or a shape close thereto. Moreover, as shown in FIG. 6B and FIG. 6C, the memory chip comprises a plurality of basic chips, which are adjacent to each other in only vertical (up and down) direction or only horizontal (right and left) direction, and thereby, the memory chip is easy to become rectangular.

The memory chip has a square or a shape close thereto, and thereby, handling is easy. Further, a plurality of basic chips is connected in only one direction, and thereby, a dicing line area is reduced; therefore, this contributes to a reduction of chip size.

As described above, the memory chip according to one embodiment of the present invention comprises the plurality of basic chips. Thus, the number of basic chips is changed, and thereby, it is possible to freely change a memory capacity of the memory chip.

Consequently, in particular, in the case of developing the COC memory chip, only design, development and evaluation of the basic chip are previously made. Then, the number of basic chips included in the memory chip is changed, and thereby, it is possible to readily satisfy the specification (memory capacity) required by the user.

By the way, the specification required by the user includes a word organization, in addition to the memory capacity. Thus, the word organization of the basic chip is changed by a control signal, and thereby, an optimum COC memory chip showing the FIG. 1 can be provided.

Figure 7:
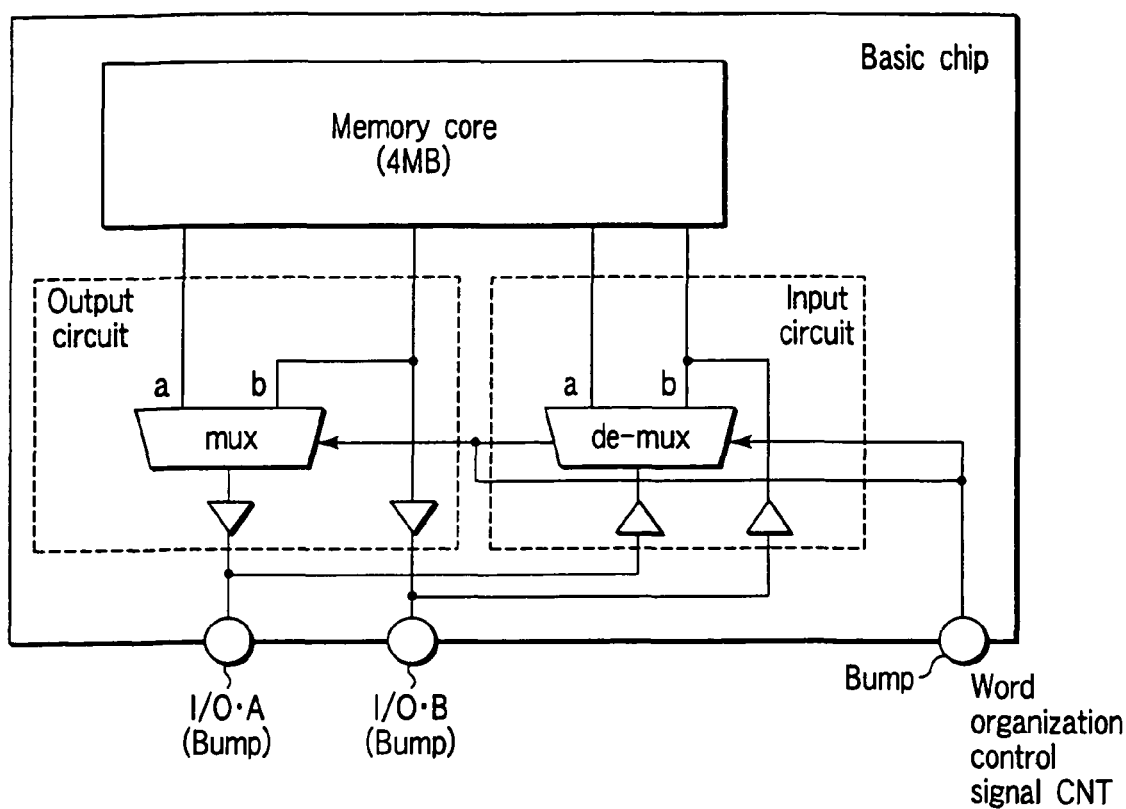
FIG. 7 is a block diagram showing a circuit for changing a word organization.

FIG. 7 shows one example of a circuit for changing a word organization of basic chip.

In this embodiment, in order to simplify the explanation, the following is a description of a basic chip, which can make a change of a word organization of 32 mega words×1 bit and a word organization of 16 mega words×2 bits.

In order to select two kinds of word organizations, 1-bit word organization control signal CNT is used. In general, in order to enable $2^n$ kinds of word organization selection, an n-bit word organization control signal CNT is used.

The above circuit is provided with two data input-output terminals (I/O·A, I/O·B).

An input circuit comprises a buffer and a de-multiplexer de-mux; on the other hand, an output circuit comprises a buffer and a multiplexer mux.

First, consider the case of employing the word organization of 32 mega words×1 bit. In this case, only data input-output terminal I/O·A is used, and data input-output terminal I/O·B is not used.

The de-multiplexer de-mux outputs a write data inputted from the data input-output terminal I/O·A to an output node a or b in accordance with a value of the word organization control signal CNT. On the other hand, the multiplexer mux outputs a read data inputted from an input node a or b to the data input-output terminal I/O·A in accordance with a value of the word organization control signal CNT.

Next, consider the case of employing the word organization of 16 mega words×2 bits. In this case, two data input-output terminals I/O·A and I/O·B are used.

The value of the word organization control signal CNT is fixed, and the de-multiplexer de-mux always outputs the write date inputted from the data input-output terminal I/O·A to the output node a. A write data inputted from the data input-output terminal I/O·B is transferred to the output node b of the de-multiplexer de-mux. On the other hand, the multiplexer mux always outputs the read date of the input node a to the data input-output terminal I/O·A. A read data inputted from the input node b of the multiplexer mux is transferred to the data input-output terminal I/O·B.

In the manner as described above, the word organization of the basic chip is changed by the control signal, and thereby, it is possible to readily provide a memory chip having a word organization required by the user.

Incidentally, the organization of the basic chip is determined in the following manner.

More specifically, first, the number of basic chips to configure a memory chip is determined based on the memory capacity required by the user. On the other hand, the word organization of the basic chip is determined by an expression of (word organization required by user)/(number of basic chips). Then, a word organization corresponding to the word organization of the basic chip thus determined is selected by the control signal CNT.

Here, in FIG. 5, there are another examples of the word organization selected by a 1-bit control signal CNT.

In this example, it is possible to select any one of 1 mega words×32 bits and 512 kilo words×64 bits as the word organization of the basic chip. In this case, when the memory chip comprises two basic chips, it is possible to select one of 1 mega words×64 bits and 512 kilo words×128 bits. Further, when the memory chip comprises four basic. chips, it is possible to select one of 1 mega words×128 bits and 512 kilo words×256 bits.

Incidentally, the above-mentioned memory chip is mounted on a logic chip, and thereby, the COC device of the present invention can be readily obtained. The control signal for changing the word organization is given from the logic chip to the basic chip included in the memory chip.

As described above, in the memory chip according to the present invention and the COC device using the memory chip, it is possible to readily change a memory capacity by changing the number of basic chips included. in the memory chip. Further, it is possible to change the word organization by using the control signal.

Accordingly, it is possible to greatly reduce the development cost without increasing the number of COC memory chip lineup. Further, the kind of memory chip is reduced; therefore, it is possible to greatly reduce manufacturing cost, stock cost and management cost. Further, the memory capacity is changed by only changing the number of the basic chips included in the memory chip, and the word organization is changed by the control signal. Therefore, it is possible to provide plentiful variations of the memory capacity and the word organization without increasing the number of COC memory chip lineup.

[Manufacturing Method]

Next, the following is a description of a manufacturing method of the memory chip according to another embodiment of the present invention and the COC device using the memory chip.

Figure 8:
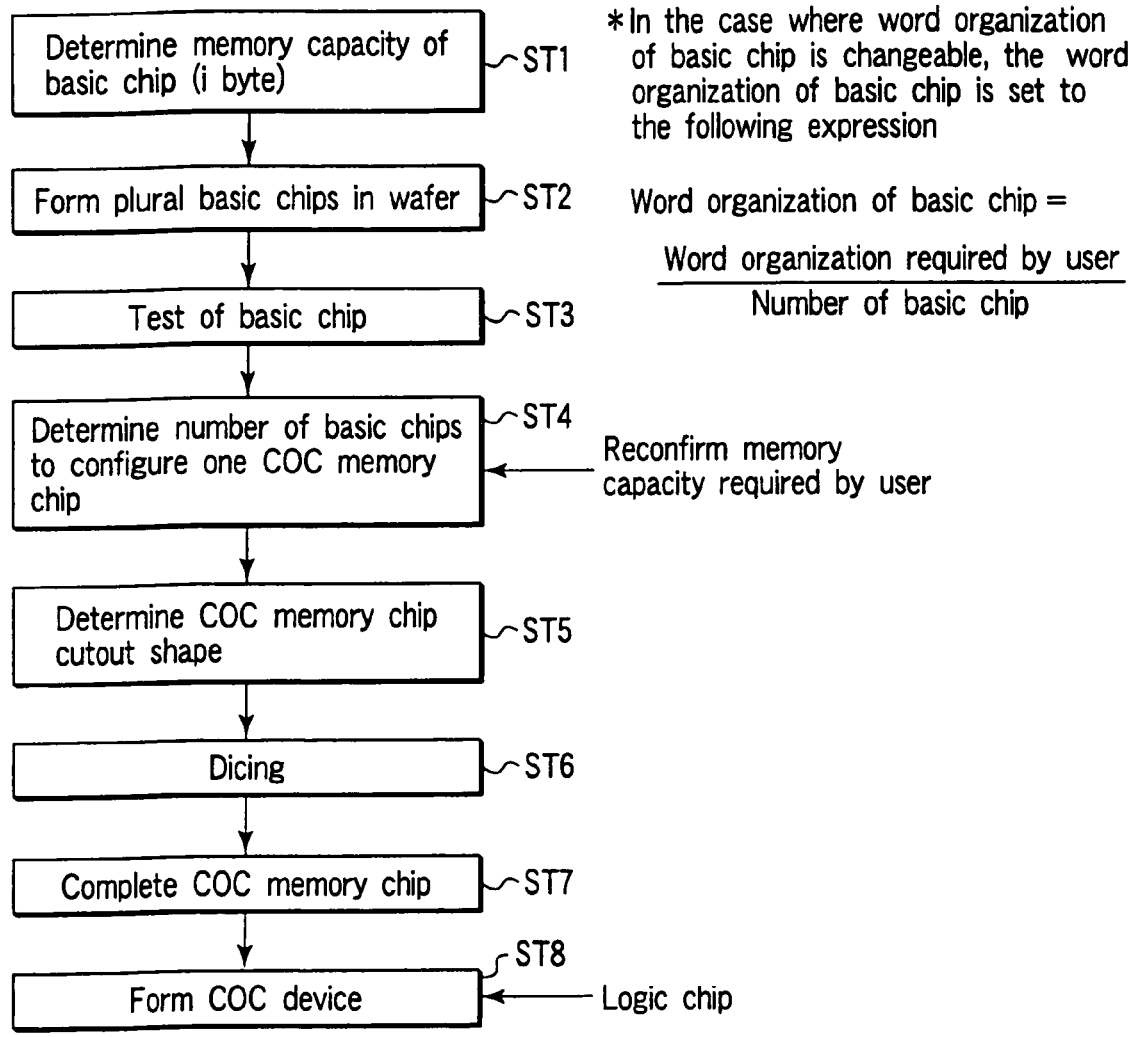
FIG. 8 is a flowchart to explain a manufacturing method according to another embodiment of the present invention.

FIG. 8 shows a flowchart of the manufacturing method of the memory chip according to another embodiment of the present invention and the COC device using the memory chip.

First, a memory capacity of a basic chip is determined (step ST1).

Preferably, the memory capacity of a basic chip is set as smaller as possible in order to widely meet the specification offered by the user. However, when the memory capacity is made small, a chip size becomes small. Moreover, although will be described later, when the chip size becomes too small, a ratio of the gross of a chip area to a wafer area becomes small; as a result, chip efficiency becomes worse.

In view of the above circumstances, a minimum value of the specification (memory capacity), which will be required by the user, is estimated, and then, the minimum value is set as a memory capacity of the basic chip. For example, the memory capacity of the basic chip is set to a value of 1 MB or more and 16 MB or less (e.g., 4 MB)

Sequentially, a plurality of basic chips is formed in the wafer (step ST2).

The plurality of basic chips is a memory chip independent from each other as descried above, and a dicing line (or scribe line) is interposed between the plurality of basic chips.

Sequentially, a test is carried out with respect to the plurality of basic chips (step ST3).

A die sort test (non-defective or defective sorting test) and burn-in are carried out with respect to the plurality of basic chips. Moreover, in each basic chip, if a defective portion of memory cell is relievable, a redundancy circuit may relieve the defective portion of memory cell. On the other hand, the basic chip incapable of relieving the defective portion is sorted as a defective chip, and then, a mountable basic chip (non-defective chip) is previously sorted out from the plurality of chips in the wafer.

Sequentially, the number of basic chips to configure a memory chip is determined (step ST4).

In the case where the memory capacity of the basic chip is i byte and the memory capacity required by the user is I byte, the number of the basic chips is as follows.

① In the case where the number of basic chips is expressed by I=i×m (where, m is a natural number), the number of basic chips is m.

② In the case where the number of basic chips is expressed by I=i×m+j (where, m is a natural number) and i>j), the number of basic chips is m+1.

③ In the case where the number of basic chips is expressed by I>i, the number of basic chips is one.

Sequentially, a memory chip cutout shape is determined (step ST5).

More specifically, the memory chip cutout shape is determined based on the position of the basic chips reconfirmed as non-defective product in step ST3 and the number of the basic chips determined in step ST4. For example, in the case where the number of the basic chips is four, the memory chip is cut out of the wafer so that basic chips as defective product are not included and the chip has a square shape or a shape close thereto.

Sequentially, dicing is carried out (step ST6, step ST7).

Dicing is carried out based on the cutout shape determined in step ST5, and thus, a memory chip is completed.

Finally, a COC device showing the FIG. 1 is formed (step ST8). By flip chip bonding, the above memory chip is mounted on a prepared logic chip, and then, the COC device is completed.

The above steps are taken, and thereby, the. memory chip and the COC device using the memory chip are formed. In the case where the basic chip has a function capable of changing the word organization, the COC device is formed, and thereafter, it is possible to change the word organization of the basic chip (or memory chip) by the control signal. That is, the word organization of the basic chip may be set to an expression of {word organization required by user (×k bit)}/(number of basic chips).

According to the above manufacturing method, the memory chip cutout shape is changed, and thereby, it is possible to obtain a memory chip having different specifications, that is, different memory capacity and different word organization, from one wafer. As a result, there is no need of increasing the number of COC memory chip lineup, and developing a memory chip for each specification required by the user. Therefore, it is possible to greatly reduce various costs, that is, development cost, manufacturing cost, stock cost and management cost.

[Chip Size and Chip Efficiency]

The memory chip according to one embodiment of the present invention comprises a plurality of basic chips, which is capable of functioning as a memory chip independent from each other, and a dicing line (or scribe line) is interposed between the plurality of basic chips. In this case, the basic chip size is arbitrarily set; on the contrary, the dicing line size (width) is set to an approximately constant value (e.g., about 0.1 mm).

Here, the following is a description of the study about a relation between a chip size and a chip efficiency (ratio of the gross of chip area to the wafer area).

Figure 9:
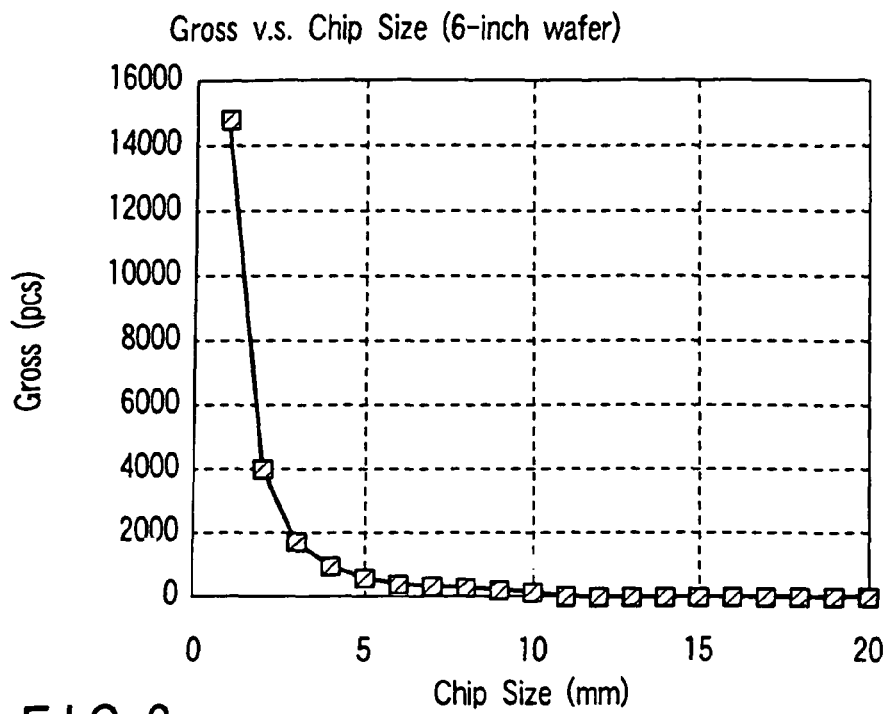
FIG. 9 is a graph showing a relation between a chip size and gross.
Figure 10:
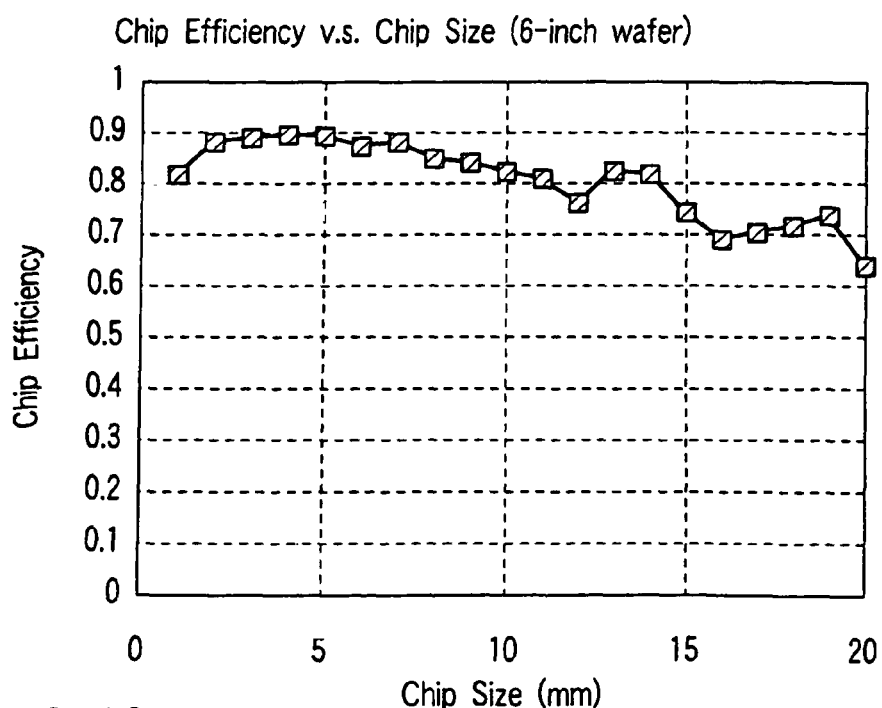
FIG. 10 is a graph showing a relation between a chip size and a chip efficiency.

FIG. 9 is a graph showing a relation between a chip size and a gross (number of chips capable of cutting out of wafer) PCS (pieces) in the case where a 6-inch wafer is used. FIG. 10 is a graph showing a relation between a chip size and a chip efficiency in the case where a 6-inch wafer is used.

Moreover, the following TABLE 1 shows individual relations of FIG. 9 and FIG. 10 using numerical values.

TABLE 1

| Chip size A | Chip size B | Gross | Chip efficiency |
|---|---|---|---|
| 1 | 1.1 | 14792 | 0.8109003 |
| 2 | 2.1 | 4004 | 0.8780002 |
| 3 | 3.1 | 1801 | 0.8885805 |
| 4 | 4.1 | 1017 | 0.8920342 |
| 5 | 5.1 | 649 | 0.8894576 |
| 6 | 6.1 | 440 | 0.8683518 |
| 7 | 7.1 | 325 | 0.8730116 |
| 8 | 8.1 | 240 | 0.8420381 |
| 9 | 9.1 | 188 | 0.8348019 |
| 10 | 10.1 | 149 | 0.8168209 |
| 11 | 11.1 | 121 | 0.8026224 |
| 12 | 12.1 | 96 | 0.7578343 |
| 13 | 13.1 | 89 | 0.8245505 |
| 14 | 14.1 | 76 | 0.8166016 |
| 15 | 15.1 | 60 | 0.7400726 |
| 16 | 16.1 | 49 | 0.6876645 |
| 17 | 17.1 | 44 | 0.6970936 |
| 18 | 18.1 | 40 | 0.7104697 |
| 19 | 19.1 | 37 | 0.7322333 |
| 20 | 20.1 | 29 | 0.6359142 |

*Wafer size: 6 inch
*Dicing line width: 0.1 mm

In this case, the dicing line width is temporarily set to 0.1 mm.

The following matters ① and ② can be seen from FIG. 9, FIG. 10 and the above TABLE 1.

① As the chip size becomes gradually large, the ratio of the dicing line in the wafer decreases, and the chip efficiency enhances.

② As the chip size becomes gradually small, in the edge portion of the wafer, a region falling short of the chip size decreases, and the chip efficiency enhances.

The above matters ① and ② have a trade-off relation, and in the case of FIG. 9, FIG. 10 and the above TABLE 1, the chip efficiency becomes the maximum (0.85 or more) in a chip size range from 2 mm (2 mm×2 mm) to 7 mm (7 mm×7 mm).

By the way, in recent years, the wafer has been made into a large diameter (the wafer size becomes larger than the chip size); as a result, the influence of the above matter ② on the chip efficiency becomes small. For this reason, the upper limit of the chip size capable of obtaining sufficiently high chip efficiency (e.g., 0.85 or more) becomes gradually large.

For example, FIG. 11, FIG. 12 and TABLE 2 show a relation between a chip size and a chip efficiency in the case where an 8-inch wafer is used, and the chip efficiency becomes the maximum (0.85 or more) in a chip size range from 2 mm (2 mm×2 mm) to 8 mm (8 mm×8 mm).

TABLE 2

| Chip size A | Chip size B | Gross | Chip efficiency |
|---|---|---|---|
| 1 | 1.1 | 26452 | 0.8156833 |
| 2 | 2.1 | 7176 | 0.8851268 |
| 3 | 3.1 | 3249 | 0.9016859 |
| 4 | 4.1 | 1829 | 0.9023952 |
| 5 | 5.1 | 1177 | 0.9073598 |
| 6 | 6.1 | 805 | 0.8936377 |
| 7 | 7.1 | 584 | 0.8824132 |
| 8 | 8.1 | 441 | 0.8703254 |
| 9 | 9.1 | 340 | 0.8492333 |
| 10 | 10.1 | 284 | 0.8757526 |
| 11 | 11.1 | 224 | 0.8357886 |
| 12 | 12.1 | 188 | 0.8348019 |
| 13 | 13.1 | 157 | 0.8181811 |
| 14 | 14.1 | 132 | 0.7977983 |
| 15 | 15.1 | 121 | 0.8395198 |
| 16 | 16.1 | 96 | 0.7578343 |
| 17 | 17.1 | 89 | 0.793142 |
| 18 | 18.1 | 73 | 0.7293415 |
| 19 | 19.1 | 68 | 0.7569709 |
| 20 | 20.1 | 60 | 0.7400726 |

*Wafer size: 8 inch
*Dicing line width: 0.1 mm

Further, FIG. 13, FIG. 14 and TABLE 3 show a relation between a chip size and a chip efficiency in the case where a 12-inch wafer is used, and the chip efficiency becomes the maximum (0.85 or more) in a chip size range from 2 mm (2 mm×2 mm) to 17 mm (17 mm×17 mm).

TABLE 3

| Chip size A | Chip size B | Gross | Chip efficiency |
|---|---|---|---|
| 1 | 1.1 | 59749 | 0.8188629 |
| 2 | 2.1 | 16257 | 0.8912119 |
| 3 | 3.1 | 7392 | 0.9117694 |
| 4 | 4.1 | 4200 | 0.9209792 |
| 5 | 5.1 | 2701 | 0.9254334 |
| 6 | 6.1 | 1869 | 0.9221304 |
| 7 | 7.1 | 1364 | 0.9159906 |
| 8 | 8.1 | 1041 | 0.9130851 |
| 9 | 9.1 | 813 | 0.9025185 |
| 10 | 10.1 | 656 | 0.8990511 |
| 11 | 11.1 | 553 | 0.9170459 |
| 12 | 12.1 | 449 | 0.8861136 |
| 13 | 13.1 | 385 | 0.8917189 |
| 14 | 14.1 | 333 | 0.8945011 |
| 15 | 15.1 | 284 | 0.8757526 |
| 16 | 16.1 | 248 | 0.8701061 |
| 17 | 17.1 | 221 | 0.8753277 |
| 18 | 18.1 | 118 | 0.8348019 |
| 19 | 19.1 | 177 | 0.8757115 |
| 20 | 20.1 | 149 | 0.8168209 |

*Wafer size: 12 inch
*Dicing line width: 0.1 mm

That is, in order to improve the chip efficiency, it is important to set the chip size within a predetermined range. In this case, the lower limit of the predetermined range of the chip size is generally 2 mm regardless of the wafer size in the case where the dicing line width is a constant value (e.g., 0.1 mm). On the other hand, there is a tendency for the upper limit of the predetermined range to gradually increase with the large diameter of wafer size.

Therefore, theoretically, if the wafer size becomes infinite, the upper limit of the chip size also becomes infinite. Eventually, it is preferable that the chip size is set to 2 mm or more in order to improve the chip efficiency.

Now, the following is a detailed description of a relation between the present invention and the chip efficiency.

Considering the case of a 12-inch wafer as the example, the chip efficiency becomes 0.85 or more in a chip size range from 2 mm (2 mm×2 mm) to 17 mm (17 mm×17 mm). Here, in order to satisfy the specifications (memory capacity) required by the user, for example, it is assumed that a chip size of 20 mm is required.

In this case, in the conventional memory chip, of course, the chip size is 20 mm (20 mm×20 mm), and according to the above TABLE 3, the chip efficiency is 0.816821. On the contrary, in the memory chip of the present invention, the memory chip comprises four basic chips individually having a chip size of 5 mm. Namely, according to the present invention, the chip size is 5 mm (5 mm×5 mm), and according to the above TABLE 3, the chip efficiency is 0.925433.

Figure 15A:
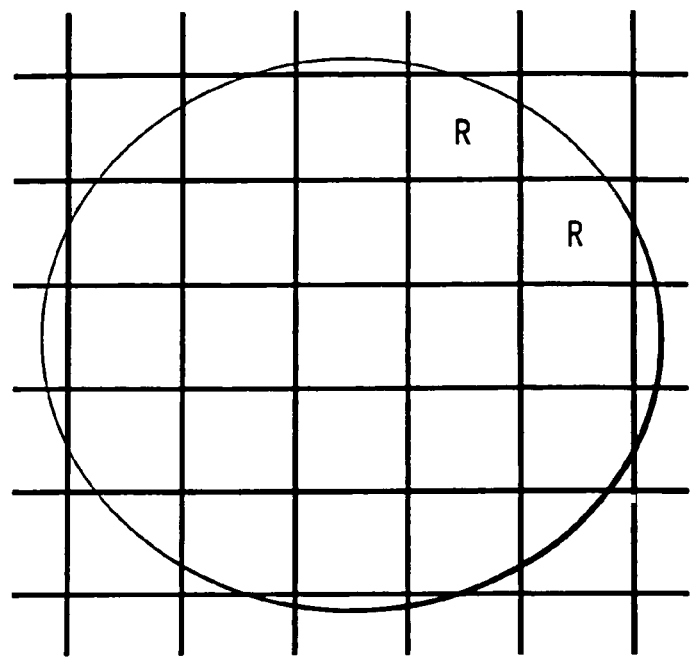
FIG. 15A is a view to explain a conventional chip efficiency.

As described above, in the memory chip according to one embodiment of the present invention, the chip efficiency can be greatly improved. FIG. 15A and FIG. 15B are views simplifying the principle described above.

More specifically, in the case of the conventional memory chip (FIG. 15A), a large region R incapable of forming a memory chip is generated in the peripheral edge portion of the wafer 11. The region R is a factor of reducing the chip efficiency. On the contrary, in the case of the memory chip of the present invention (FIG. 15B), it is possible to form a plurality of basic chips F in the peripheral edge portion of the wafer 11. The basic chip F on the peripheral edge portion is a factor of making the difference in the chip efficiency between the present invention and the conventional memory chip.

[Modification Examples]

The following is a description of modification examples of the memory chip of the present invention.

Figure 16:
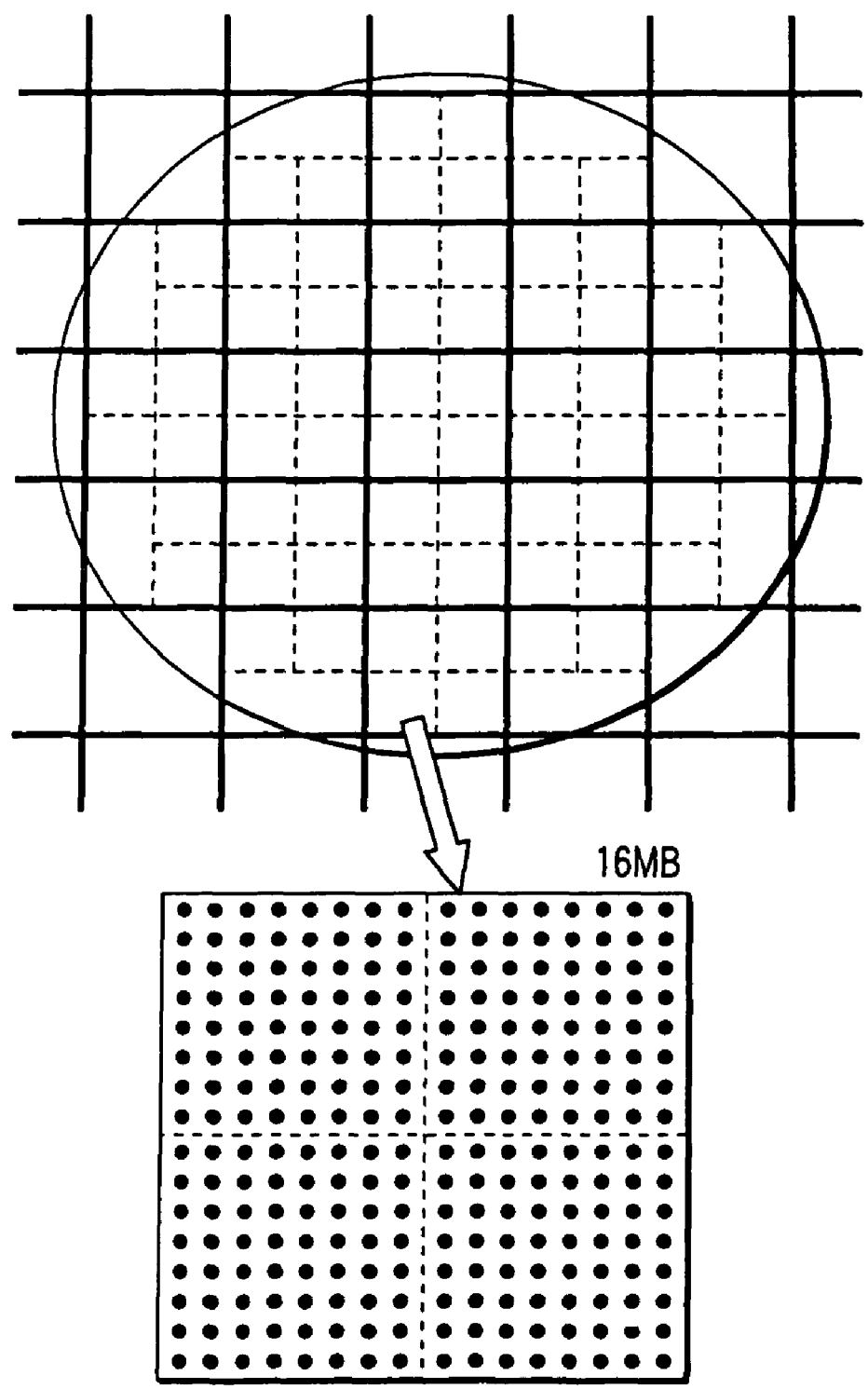
FIG. 16 is a view showing another memory chip according to one embodiment of the present invention.

The features of a memory chip shown in FIG. 16 are an array of bumps formed on the basic chip. In the present invention, the bump array itself is not specially limited, and various array patterns may be employed. In this modification example, the bump is laid on the entire surface of the basic chip, and the number of terminals is set to the maximum number of bumps capable of arranging on the chip.

Figure 17:
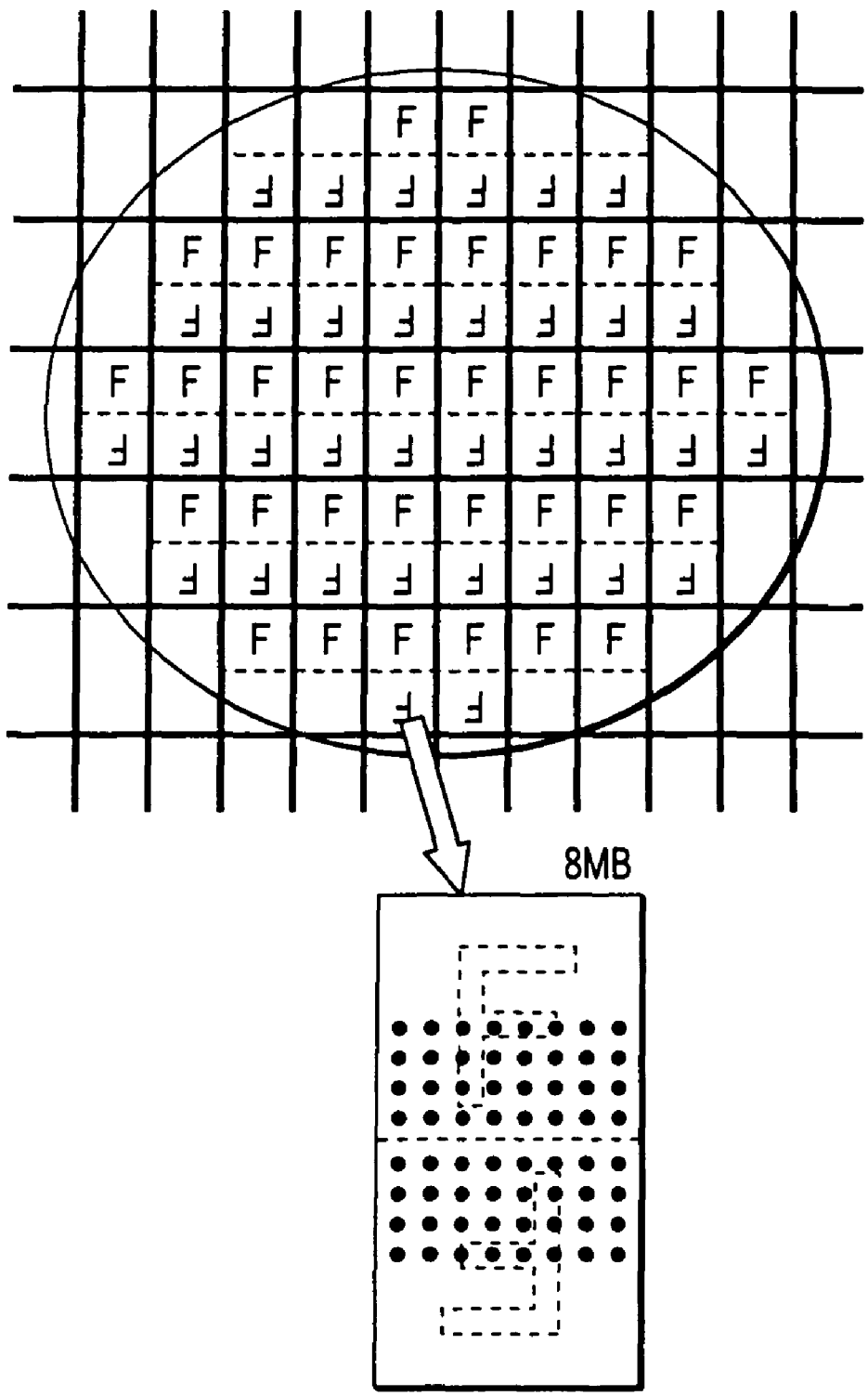
FIG. 17 is a view showing another memory chip according to one embodiment of the present invention.
Figure 19:
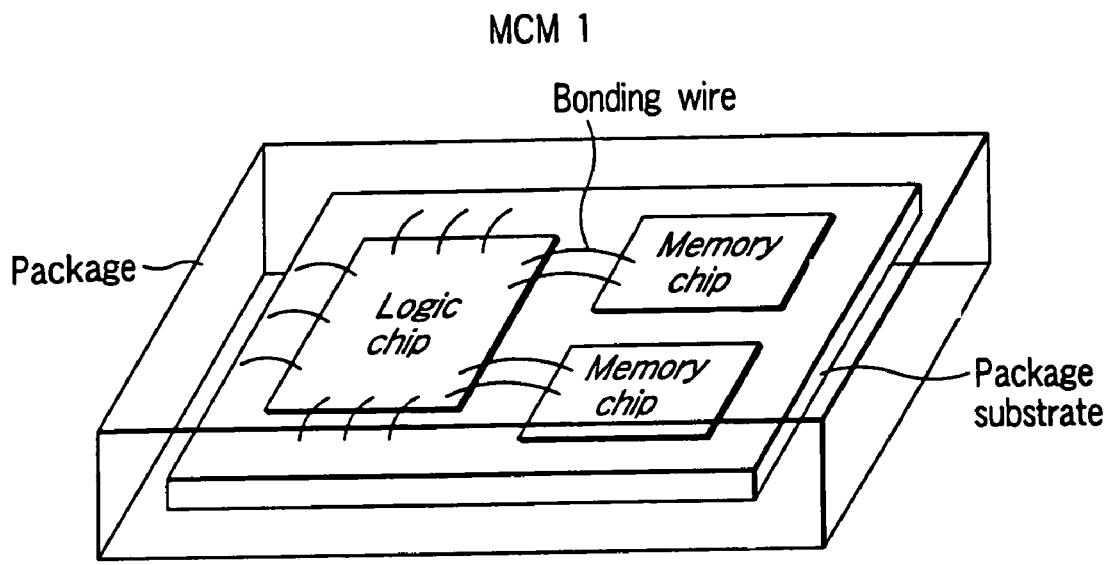
FIG. 19 is a view showing MCM device according to one embodiment of the present invention.
Figure 21:
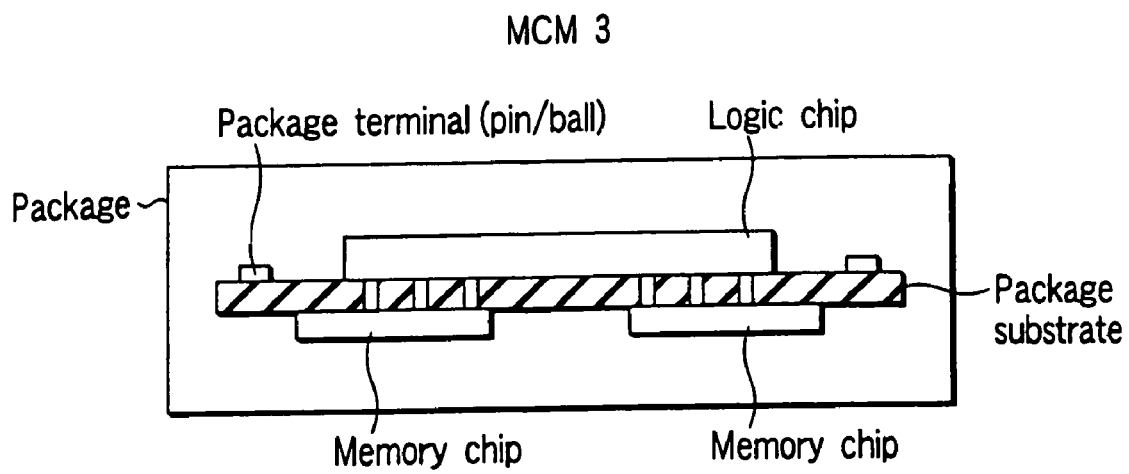
FIG. 21 is a view showing MCM device according to one embodiment of the present invention.
Figure 20A:
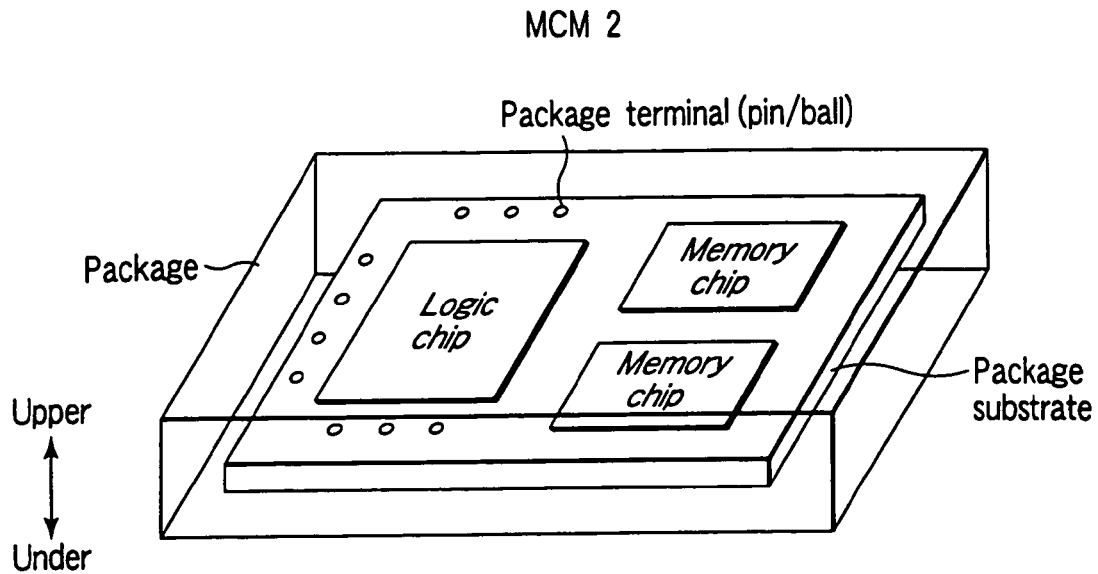
FIG. 20A is a view showing MCM device according to one embodiment of the present invention.
Figure 20B:
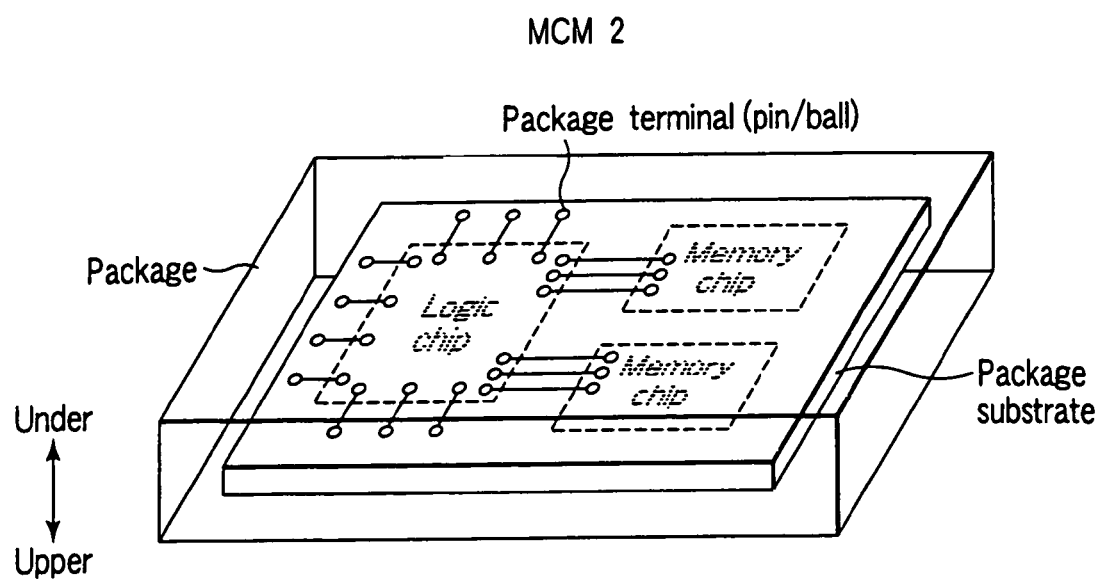
FIG. 20B is a view showing MCM device according to one embodiment of the present invention.

In a memory chip shown in FIG. 17, two kinds of basic chips having the following layout are prepared. More specifically, one is a basic chip having a normal layout; another is a basic chip having a layout inverting the normal layout. The above two kinds of basic chips can be readily obtained by inverting a photo mask in the manufacturing process.

In the case of this modification example, even if the memory chip shape and the number of basic chips are the same, plural kinds of memory chips are obtained depending on the memory chip cutout shape; therefore, variations of memory chip can be increased. For example, in the same wafer, a memory chip is cut out so as to have a shape as shown in FIG. 17, and thereby, it is possible to obtain a memory chip in which the bump is concentrated on the center of chip. Further, a memory chip is cut out so as to have a shape as shown in FIG. 18, and thereby, it is possible to obtain a memory chip in which the bump is concentrated on the edge portion of the chip.

FIGS. 19, 20A, 20B and 21 show a MCM device including the memory chip according to one embodiment of the present invention.

A memory chip and a logic chip are provided on a package substrate in a package. In this case, each memory chip is electrically connected each other by conductive lines. The conductive lines are each shortly and regularly. As a result, a system according to the present invention has a good performance.

The memory chip according to one embodiment of the present invention is adaptable to the COC device, and besides, for example, is applicable to packaging (mounting) technology such super connect technology, inter boarder technology and the like. The above super connect technology is packaging technology of mounting a chip on one main side of a silicon substrate in which interconnect pattern is formed. On the other hand, the above inter boarder technology is packaging technology of mounting a chip on double sides a silicon substrate in which interconnect pattern is formed.

As is evident from the above description, in the memory chip according to one embodiment of the present invention and the semiconductor device (ex. SiP device, COC device, MCM device), the number of basic chips included in the memory chip is changed, and thereby, it is possible to readily change the memory capacity. Further, it is possible to change the word organization by the control signal.

Accordingly, it is possible to greatly reduce development cost without increasing the number of the memory chip lineup for SiP. Further, it is possible to reduce the kind of memory chips, and thus, to greatly reduce various costs, that is, manufacturing cost, stock cost and management cost. Further, the memory capacity is changeable by only changing the number of basic chips included in the memory chip, and the word organization is changeable by the control signal; therefore, it is possible to provide plentiful variations of the memory capacity and the word organization without increasing the number of memory chip lineup for SiP.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed:

1. A manufacturing method of a COC device comprising:
   forming basic chips in a wafer, each of said basic chips functioning independently;
   forming a memory chip including at least two of said basic chips by dicing the wafer;
   mounting the memory chip on a logic chip;
   executing, in the logic chip, a division which divides a word organization of the memory chip by the number of basic chips;
   generating a control signal indicating a value of the division executed in the logic chip;
   supplying the control signal from the logic chip to each basic chip; and
   deciding, in each basic chip, a word organization of each basic chip based on the value of the division,
   wherein the word organization of each basic chip is changeable by the control signal.

2. The manufacturing method according to claim 1, further comprising determining a number of said basic chips comprising the memory chip and a shape of the memory chip based on a memory capacity of the memory chip, before forming the memory chip.

3. The manufacturing method according to claim 1, wherein an area between said basic chips is a dicing line which connects said basic chips and configures a part of the memory chip.

4. The manufacturing method according to claim 1, wherein the memory chip is mounted on the logic chip by flip chip bonding.

5. The manufacturing method according to claim 1, wherein the logic chip and the memory chip are combined by a bump.

6. The manufacturing method according to claim 1, wherein the logic chip and the memory chip are combined by a bonding wire.

7. The manufacturing method according to claim 1, wherein the logic chip and the memory chip are combined by a conductive plug.

8. The manufacturing method according to claim 1, wherein each of said basic chips has the same layout.

9. The manufacturing method according to claim 1, wherein each of said basic chips includes basic chips of different layouts.

10. The manufacturing method according to claim 1, wherein each of said basic chips has a square shape.

11. The manufacturing method according to claim 10, wherein one side of each of said basic chips has a length of 2 mm or more.

12. The manufacturing method according to claim 1, wherein the dicing is executed along a dicing line having a width of 0.1 mm.

13. The manufacturing method according to claim 1, wherein the memory chip has a square shape.

14. The manufacturing method according to claim 1, wherein the logic chip has a square shape.

15. The manufacturing method according to claim 1, wherein the memory chip is a DRAM chip.

16. The manufacturing method according to claim 1, wherein the memory chip is a Flash chip.

17. The manufacturing method according to claim 1, further comprising:
   determining a memory capacity of each of the basic chips, before forming the basic chips;
   testing each of the basic chips, after forming the basic chips and before forming the memory chip; and
   determining a number of said basic chips comprising the memory chip and a shape of the memory chip based on a memory capacity of the memory chip, after testing each of the basic chips and before forming the memory chip.

18. The manufacturing method according to claim 3, wherein an alignment mark is formed in the area.

19. The manufacturing method according to claim 3, wherein a test element group is formed in the area.

* * * * *